United States Patent [19]

Holderfield et al.

[11] Patent Number: 4,881,411

[45] Date of Patent: Nov. 21, 1989

[54] SPECIMEN HOLDER AND ROTARY ASSEMBLY

[75] Inventors: Daron C. Holderfield, Boaz; Bernard E. Martin, Huntsville, both of Ala.; Samuel S. Russell, Irmo, S.C.

[73] Assignee: The United States of America as represented by the Secretary of the Army, Washington, D.C.

[21] Appl. No.: 263,305

[22] Filed: Oct. 27, 1988

[51] Int. Cl.[4] .............................................. G01N 3/04
[52] U.S. Cl. ........................................ 73/856; 269/35
[58] Field of Search .................... 324/537, 73 PC, 555, 324/531; 29/593; 437/8; 73/856; 279/3; 269/21, 35

[56] References Cited

U.S. PATENT DOCUMENTS 4,258,928  3/1981  Wiesler ............................... 279/3 X

FOREIGN PATENT DOCUMENTS 33835  8/1979  Japan ..................................... 269/21

Primary Examiner—Jerry W. Myracle
Attorney, Agent, or Firm—Freddie M. Bush; James T. Deaton

[57] ABSTRACT

A specimen holder and rotary mount in which a semiconductor chip can be accurately mounted and presented to a test device for checking the circuitry of the semiconductor chip as well as subjecting the chip to various thermal conditions.

14 Claims, 1 Drawing Sheet

SPECIMEN HOLDER AND ROTARY ASSEMBLY

The invention described herein was made in the course of or under a contract or subcontract thereunder with the Government and by a Government employee and may be manufactured, used, and licensed by or for the Government for Government purposes without the payment to us of any royalties thereon.

CROSS REFERENCE TO RELATED APPLICATION

This application is related to applicants co-pending application Ser. No.: 263,466 by Daron C. Holderfield Bernard E. Martin, and Samuel S. Russel in that this invention is used in the system disclosed in application Ser. No: 263,466 filed Oct. 27, 1988.

BACKGROUND OF THE INVENTION

There is a need for a mechanism in which a semiconductor chip can be mounted and tested as an individual unit rather than after it is incorporated in an assembly. This invention provides a structure for mounting such a semiconductor chip for determining the reliability of semiconductor chips under test by appropriate mechanisms for conducting the desired test. Under conventional chip testing, reliability is determined using two industry standard methodologies: (a) wafer probing where an array of chips on a wafer are probed at room temperature; and (b) statistical sampling with thermal stress.

Wafer probing technology has been the accepted way for chip testing where the micro-electronic devices are electrically tested at room temperature. A wafer is usually four or five inches in diameter and contains an array of several chips of the same type. After probing, the wafer is scribed (cut) and separated and the individual chips are then available for use on the production floor. Wafer probing is a static test, meaning electrical continuity between critical parts are verified, but total electrical function is not determined due to time constraints and associated cost. Thermal screening is not technically feasible since there is not a thermal forcing technique available that can rapidly cycle the large mass of a four or five inch wafer. Therefore, chip integrity is still questionable after wafer probing is evaluated only by visual inspection.

Statistical sampling is another industry accepted chip testing practice used to determine complete electrical functions and operating reliability, including MIL-SPEC temperature ranges. Under this methodology, one to two percent of the individual chips are separated from the wafer and mounted into a custom test fixture and subjected to dynamic electrical and thermal evaluation. Based upon the compiled test results, predictions are made concerning the other 98 to 99 percent of chips. The chips which are used for test purposes are not usable after mounting in the test fixture.

Therefore, for the most part, chip reliability is unknown until they are assembled into the final electrical package (usually a Hybrid Microelectronic Assembly (HMA) which is used extensively in military and space applications), and the completed HMA package is subjected to MIL-SPEC final test. At this point in the manufacturing process non-functional HMA packages must undergo labor intensive troubleshooting to determine the cause of failure, and faulty chips must be removed and replaced per MIL-SPEC procedures. In many cases the cost of repairing a faulty HMA package exceeds the cost of producing the entire package.

Accordingly, it is an object of this invention to provide a mount by which an individual chip can be accurately mounted for individual test of the chip.

Another object of this invention is to provide a mount which has two specimen holders located opposite each other so that while a specimen or chip is being tested from one mount the other mount can be loaded for testing after the first specimen is tested.

Still another object of this invention is to provide a mount that can be rotated between positions which are 180 degrees apart and accurately held in these precise positions when actuated thereto.

Still another object of this invention is to provide a mount for a test specimen in which the mount has such structure as to enable the test specimen to be quickly cycled from one test temperature to another.

Other objects and advantages of this invention will be obvious to those skilled in this art.

SUMMARY OF THE INVENTION

In accordance with this invention, a specimen holder and rotary assembly is provided for mounting of semiconductor chips to be tested, and the rotary assembly includes two specimen holders thereon with the rotary assembly being rotatable and maintainable in opposite rotary positions so that the chips located on the respective specimen holder can be accurately engaged and have electrical tests performed on the chip as well as thermo-cycling of the chip during testing thereof.

DESCRIPTION OF THE PREFERRED EMBODIMENTS

Figure 2:
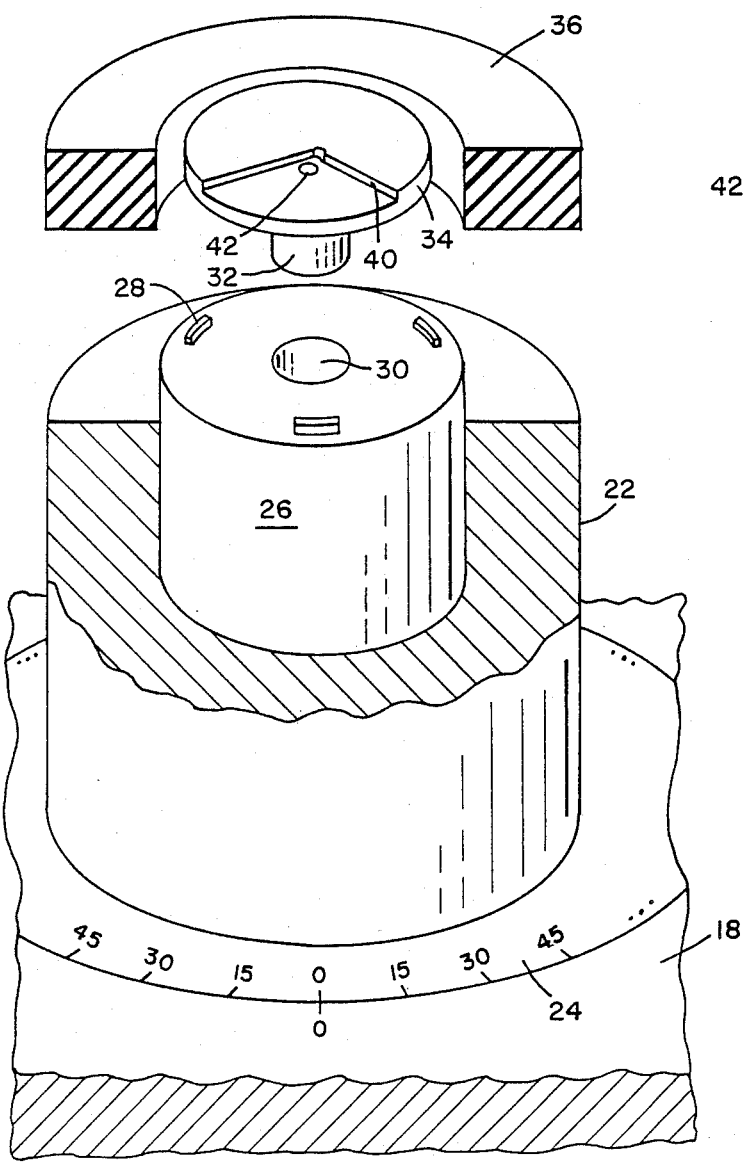
FIG. 2 is a pictorial view partially cut away and partially in section and illustrating the specific structure of a chip or specimen holder.
Figure 3:
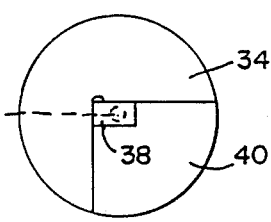
FIG. 3, is a top view of the chip holder and illustrating a chip thereon.
Figure 4:
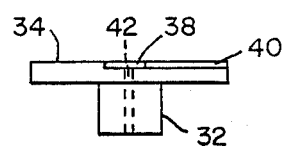
FIG. 4 is a side view of the chip holder.

Referring now to the drawings, a specimen or chip holder arrangement and rotary assembly arrangement according to this invention includes a base 10 with a precision rotary mount 12 secured thereto in a conventional manner and with a rotary platform 14 secured in a conventional manner at a upper end of precision rotary mount 12. Platform 14 has two rotatably adjustable specimen mounts 16 secured thereto on an upper surface of rotary platform 14 in a conventional manner. Each specimen mount 16 includes a base section 18 with precision gear adjusting mechanism therein to be adjusted by knob 20 to rotatably adjust cylindrical support section 22. The adjusted position of cylindrical support section 22 is indicated by indicia 24 connected to rotary support section 22 and indicia on the top of base section 18 as illustrated in FIG. 2. Rotary support 22 has an opening in the top thereof or receiving and mounting die table support or holder 26. Die table support 26 has three equally spaced spacers 28 at the top thereof as illustrated and an opening 30 for receiving cylindrical portion 32 of die table 34. A rubber seal or equivalent sealing means 36 is positioned at the top of rotary support 22 and seals around the top of die table support 26.

Seal 36 is designed to be spaced from the outer circumference of die table 34 so as to allow air to be circulated underneath die table 34 to cause a chip specimen 38 as well as die table 34 to be heated or cooled by air blown thereover to quickly adjust or cycle the temperature of the chip specimen that is to be tested. Die table 34 has a right angle cutout section 40 which is designed to receive semiconductor chips to be tested. An opening 42 through die table 34, die table support 26, rotary support 22, base 18 and rotary mount 14 allows a vacuum tube 44 to be connected in a conventional manner to apply vacuum to a portion of the undersurface of a semiconductor chip such as 38 when mounted in position on die table 34. This holds the test specimen chip 38 in an accurate position for testing of the multiplicity of circuits contained therein. An example of the size of such a chip is 0.05 inches by 0.09 inches with a thickness of 0.015 inches. This is just an example of a typical chip that is to be tested and chips of other sizes can be tested as well with this device. It is also noted that die table 34 can be made of materials such as copper plated with gold or from a good thermal and insulating material such as a ceramic or Macor and is secured to die table support 26 by being bonded thereto in a conventional manner and by die table support 26 being bonded to rotary support 22 in a conventional manner. Die table support 26 is preferably made of a ceramic such as Macor.

Figure 1:
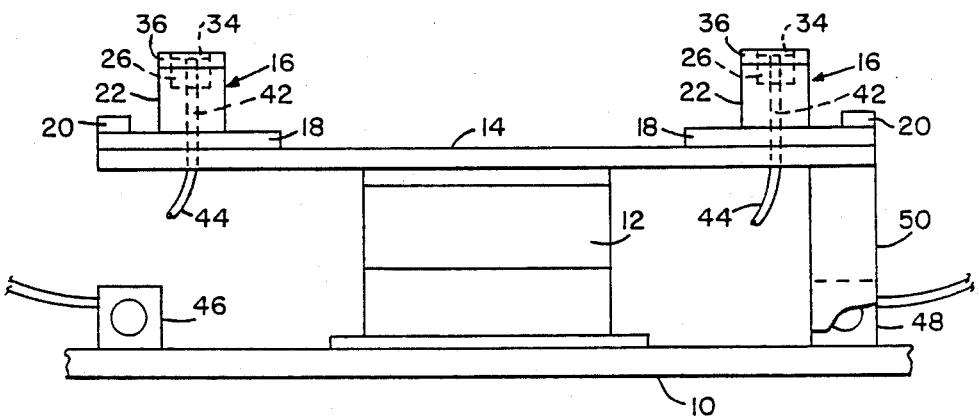
FIG. 1 is a side view illustrating the overall arrangement of specimen holders mounted on a rotary assembly.

Base 10 has two electro-magnets 46 and 48 mounted thereon in a conventional manner and rotary platform 14 has arm 50 integrally secured thereto for fixing rotary platform 14 in a first predetermined position as illustrated in FIG. 1 with arm 50 engaging electro-magnet 48 and a second predetermined position which is 180 degrees from the first position where arm 50 contacts electro-magnet 46. Electro-magnets 46 and 48 are provided to securely and accurately hold rotating platform 14 in an exact position relative to test equipment that is to be used in testing semiconductor chip 38 on die table 34 by arm 50 being attracted and held by electro-magnet 46 or 48.

In operation, when it is desired to test a semiconductor chip 38, chip 38 is usually picked up with a vacuum pick or pencil and placed on cutout surface 40 of die table 34 and then vacuum is applied through line 44 to hold chip 38 in place. Rotary table 14 is then rotated 180 degrees to a position for testing of semiconductor chip 38. If chip 38 is not perfectly aligned, knob 20 is adjusted to rotate rotary mount 22 and die table 34 to accurately align micro-chip 38. The desired tests are then conducted on chip 38. As test are being conducted on chip 38 on its mount, another semiconductor chip 38 is placed on the other die table and made ready for testing when testing is complete on the first chip. Electro-magnets 46 or 48 are turned on when rotary table 14 is rotated to the test position to maintain rotary table 14 in a fixed relationship and are turned off when the test is completed. With this arrangement, an accurate alignment of the die table with the chip thereon is accurately alignable and maintained in accurate alignment for testing of the semiconductor chip 38. Die table 34 is spaced from the upper surface of die table support 26 by spacers 28 so that heating or cooling can be applied to semiconductor chip 38 to quickly adjust the temperature of semiconductor chip 38 for a specific test at a specific temperature. Typical temperatures that micro-chip 38 can be tested at include ambient or plus 25 degrees Celsius, minus 55 degree Celsius and plus 125 degrees Celsius. Other temperatures may be appropriate depending upon the particular environment that the semiconductor chip is to be used in.

We claim:

1. A mount for mounting a chip test specimen and including a die table having an upper surface with a 90 degree angle arc segment cut-out in the surface thereof to provide an indented flat surface from a periphery of said die table to said 90 degree angle for mounting of a chip test specimen and means in said flat surface for applying vacuum to the test specimen to secure the test specimen in a predetermined position relative to the sides of the 90 degree angle cut-out.

2. A mount as set forth in claim 1, wherein said die table is a separate piece from a support on which the die table is secured and the die table being spaced from the support by projections on the support for allowing cooling of the die table from both the top surface and an under surface of the die table to allow the test specimen to be readily subjected to surrounding temperature media.

3. A mount as set forth in claim 2, wherein said support is secured in a rotary support section and said rotary support section being mounted on a platform that is rotatable and said rotary support section having adjustable means to allow the angular position of said die table and said support to be adjusted.

4. A mount as set forth in claim 3, wherein said rotatable platform is rotatably mounted by precision rotary mount means and said rotating platform having a projection arm thereon, and an electro-magnet mounted for cooperating with said arm when said electro-magnet is energized to securely hold said arm in a pre-determined position.

5. A mount as set forth in claim 4, wherein said rotating platform has a plurality of said rotary support sections with said die table and said support mounted thereon, and a second electro-magnet mounted for cooperation with said arm to alternately hold said arm positions 180 degrees apart.

6. A mount for a test specimen, said mount including a die table having an upper surface that has an angle arc segment removed to define side surfaces and a base surface that are adapted for accurately mounting a test specimen there against, said base surface having vacuum means thereat for applying vacuum to the test specimen for securely holding the test specimen in position.

7. A mount for a test specimen as set forth in claim 6, wherein said die table is made of electrical conductive material to enable said die table to provide a ground plane for the test specimen.

8. A mount for a test specimen as set forth in claim 7, wherein said die table is mounted in a base structure with said base structure having spacers for spacing the die table from a top surface of the base structure and said die table being secured in a fixed position relative to said base structure.

9. A mount for a test specimen as set forth in claim 8, wherein said base structure is mounted in a rotatably adjustable support section to enable the die table and base structure to be adjusted.

10. A mount for a test specimen as set forth in claim 9, wherein said base structure has a larger diameter than said die table to enable air to be circulated around the die table in a relatively free manner and a seal mounted around the base structure and around the die table to enable the structure to be sealed and mounted relative to a test device.

11. A mount for mounting a chip test specimen and including a die table having a surface with a means for accurately mounting a chip test specimen and means in said surface for applying vacuum to the test specimen to secure the test specimen in a predetermined position relative to the accurate mounting means, said die table being a separate piece from a support on which the die table is secured and the die table being spaced from the support by projections mounted for allowing cooling of the die table from both the top surface and an under surface of the die table.

12. A mount as set forth in claim 11, wherein said support is secured in a rotary support section and said rotary support section being mounted on a platform that is rotatable and said rotary support section having adjustable means to allow the angular position of said die table and said support to be adjusted.

13. A mount as set forth in claim 12, wherein said rotatable platform is rotatably mounted by precision rotary mount means and said rotating platform having a projection arm thereon, and an electro-magnet mounted for cooperating with said arm when said electro-magnet is energized to securely hold said arm in a pre-determined position.

14. A mount as set forth in claim 13, wherein said rotating platform has a plurality of said rotary support sections with said die table and said support mounted thereon, and a second electro-magnet mounted for co-operation with said arm to alternately hold said arm positions 180 degrees apart.

* * * * *